US012062196B2

(12) United States Patent
Yan et al.

(10) Patent No.: US 12,062,196 B2
(45) Date of Patent: Aug. 13, 2024

(54) METHOD AND SYSTEM FOR REGISTERING CIRCUIT DESIGN LAYOUT AND SCANNING ELECTRON MICROSCOPE IMAGE, CIRCUIT DESIGN LAYOUT AND IMAGING ERROR CALCULATION METHOD THEREOF, AND ELECTRONIC DEVICE

(71) Applicant: SHENZHEN JINGYUAN INFORMATION TECHNOLOGY CO., LTD, Shenzhen (CN)

(72) Inventors: Ge Yan, Shenzhen (CN); Qiang Li, Shenzhen (CN)

(73) Assignee: SHENZHEN JINGYUAN INFORMATION TECHNOLOGY CO., LTD, Shenzhen (CN)

( * ) Notice: Subject to any disclaimer, the term of this patent is extended or adjusted under 35 U.S.C. 154(b) by 355 days.

(21) Appl. No.: 17/389,394

(22) Filed: Jul. 30, 2021

(65) Prior Publication Data

US 2022/0092799 A1 Mar. 24, 2022

Related U.S. Application Data

(63) Continuation of application No. PCT/CN2019/073986, filed on Jan. 30, 2019.

(51) Int. Cl.
*G06K 9/00* (2022.01)
*G06T 5/70* (2024.01)
(Continued)

(52) U.S. Cl.
CPC ............... *G06T 7/337* (2017.01); *G06T 5/70* (2024.01); *G06T 7/13* (2017.01); *G06T 11/40* (2013.01);
(Continued)

(58) Field of Classification Search
None
See application file for complete search history.

(56) References Cited

U.S. PATENT DOCUMENTS

2012/0300056 A1 11/2012 Ban et al.
2020/0143099 A1* 5/2020 Wu ..................... G06F 30/398

FOREIGN PATENT DOCUMENTS

CN 101178812 A 5/2008
CN 107818576 A 3/2018
(Continued)

*Primary Examiner* — Wei Wen Yang
(74) *Attorney, Agent, or Firm* — Andrew C. Cheng

(57) ABSTRACT

The present invention provides a method for registering a circuit design layout and a scanning electron microscope image. The method comprises: step S1, providing a circuit design layout and a scanning electron microscope image; step S2: processing the circuit design layout to acquire a binary design layout image, and processing the scanning electron microscope image to acquire a binary scanning electron microscope image; step S3: performing Gaussian filtering on the binary design layout image and the binary scanning electron microscope image to maximize a gray value at a central axis of regions corresponding to a design pattern and a scanned pattern; and Step S4: performing registration according to the central axis of the design pattern and the scanned pattern. The present invention also provides a system for registering a circuit design layout and a scanning electron microscope image, a circuit design layout and an imaging error calculation method thereof, and an electronic device. The method and system for registering a circuit design layout and a scanning electron microscope image, the circuit design layout and the imaging error calculation method thereof, and the electronic device feature accurate registration and accurate error calculation.

9 Claims, 10 Drawing Sheets

(51) Int. Cl.
    *G06T 7/13*      (2017.01)
    *G06T 7/33*      (2017.01)
    *G06T 11/40*     (2006.01)

(52) U.S. Cl.
    CPC ............... *G06T 2207/10061* (2013.01); *G06T 2207/30148* (2013.01)

(56) References Cited

FOREIGN PATENT DOCUMENTS

| | | | |
|---|---|---|---|
| CN | 108257166 A | 7/2018 | |
| CN | 108648168 A | 10/2018 | |
| CN | 109148433 A | 1/2019 | |
| JP | 4002655 B2 * | 11/2007 | ............. G06T 5/006 |

* cited by examiner

10

S1: Provide a circuit design layout to be registered and a scanning electron microscope image to be registered, the circuit design layout to be registered includes at least one design pattern, the scanning electron microscope image to be registered includes at least one scanning pattern corresponding to the at least one design pattern, the at least one design pattern covers the at least one scanning pattern

S2: binarize the circuit design layout to be registered to obtain a binary image of the circuit design layout and binarizing the scanning electron microscope image to be registered to obtain a binary image of the scanning electron microscope image, in the binary image of the circuit design layout to be registered, a gray value of the design pattern is 1, and a gray value outside the design pattern is 0; in the binary image of the scanning electron microscope image to be registered, a gray value of the scanning pattern is 1, and a gray value outside the scanning pattern is 0

S3: Gaussian filter the binary image of the circuit design layout and the binary image of the scanning electron microscope image to make the gray value to be the largest at central axes of areas where the design pattern and the scanning pattern are located

S4: register the circuit design layout and the scanning electron microscope image according to the central axes.

FIG. 1

METHOD AND SYSTEM FOR REGISTERING CIRCUIT DESIGN LAYOUT AND SCANNING ELECTRON MICROSCOPE IMAGE, CIRCUIT DESIGN LAYOUT AND IMAGING ERROR CALCULATION METHOD THEREOF, AND ELECTRONIC DEVICE

FIELD

The subject matter herein generally relates to integrated circuit manufacturing, in particular to a method and system for registering a circuit design layout and a scanning electron microscope image, a circuit design layout and imaging error calculation method thereof, and an electronic device.

BACKGROUND

With continuous reduction in a size of pattern feature on a mask, diffraction phenomenon of light becomes more and more obvious, resulting in deformation and indistinguishable phenomenon of imaging on a silicon wafer. This phenomenon is called optical proximity effect. In order to improve imaging quality, people can optimize the pattern on the mask to correct the optical proximity effect, namely OPC (optical proximity correction). Therefore, OPC plays an important role in lithography processes of semiconductor devices manufacturing.

However, as circuit layouts of lithography becomes more and more complex, measurement requirements for key dimensions become more complex and diversified in order to characterize key OPC models. A SEM (scanning electron microscope) is a basic tool for measuring sizes of fine patterns formed in semiconductor technology, especially a CD-SEM (key size scanning electron microscope) can measure high-precision semiconductor equipment. In order to more accurately measure differences between key dimensions of actually produced semiconductor equipment and circuit design layouts, it is necessary to align a SEM scanning image obtained by scanning the semiconductor equipment with a circuit design layout. However, there are some difficulties in a registration process. Among existing registration methods, there is no fast and efficient registration method based on a circuit design layout and a scanning electron microscope image.

SUMMARY

In order to solve the problem of the existing registration methods for registering a circuit design layout and a scanning electron microscope image, the present disclosure provides a system and a method for registering a circuit design layout and a scanning electron microscope image, a circuit design layout and imaging error calculation method and an electronic device.

The present disclosure provides a scheme to solve the above-mentioned problem: a method for registering a circuit design layout and a scanning electron microscope image, includes: Step SL: providing a circuit design layout to be registered and a scanning electron microscope image to be registered, wherein the circuit design layout to be registered includes at least one design pattern, and the scanning electron microscope image to be registered includes at least one scanning pattern corresponding to the at least one design pattern, the at least one design pattern covers the at least one scanning pattern; Step S2: binarizing the circuit design layout to be registered to obtain a binary image of the circuit design layout and binarizing the scanning electron microscope image to be registered to obtain a binary image of the scanning electron microscope image, wherein in the binary image of the circuit design layout, a gray value of the design pattern is 1, and a gray value outside the design pattern is 0; in the binary image of the scanning electron microscope image, a gray value of the scanning pattern is 1, and a gray value outside the scanning pattern is 0; Step S3: Gaussian filtering the binary image of the circuit design layout and the binary image of the scanning electron microscope image to make the gray value to be the largest at central axes of areas where the design pattern and the scanning pattern are located; and Step S4: registering the circuit design layout and the scanning electron microscope image according to the central axes.

Preferably, Step S1 includes: Step S11: obtaining coordinates of the scanning pattern in the scanning electron microscope image; Step S12: determining an area in the circuit design layout corresponding to the design pattern according to the coordinates; and Step S13: expanding a distance D to the area to obtain an area where the design pattern corresponding to the scanning pattern is located, wherein D is not greater than 50 nm.

Preferably, before Step S2 or in Step S2, the method includes Step Sa0: smoothing the design pattern in the circuit design layout to be registered; wherein Step S2 further includes Step Sa1: filling the design pattern to obtain the binary image of the circuit design layout, in the binary image of the circuit design layout, a gray value of the design pattern is 1, and a gray value outside the design pattern is 0.

Preferably, Step S2 includes Step Sb1: extracting a contour of the scanning pattern in the scanning electron microscope image to be registered; and Step Sb2: filling the scanning pattern to obtain the binary image of the scanning electron microscope image, in the binary image of the scanning electron microscope image, a gray value of the scanning pattern is 1, and a gray value outside the scanning pattern is 0.

Preferably, Step Sb1 includes Step Sb1-1: obtaining edges of the scanning pattern based on an edge detecting algorithm in image processing; and Step Sb1-2: obtaining a contour of the scanning pattern.

Preferably, Step Sb1 includes: Step Sb1-1': etching the scanning electron microscope image to be registered; and Step Sb1-2': obtaining a contour of the scanning pattern based on an edge detecting algorithm in imaging processing.

Preferably, Step Sb1 includes: Step Sb1-$a$: presetting gray value threshold; and Step Sb1-$b$: comparing a pixel value of each pixel in the scanning electron microscope image with the gray value threshold to obtain a contour of the scanning pattern.

Preferably, the binary image of the circuit design layout is Gaussian filtered to obtain a first image, and the binary image of the scanning electron microscope image is Gaussian filtered to obtain a second image; Step S4 includes registering the design pattern and the scanning pattern by an image template matching method.

Preferably, the image template matching method includes a normalized correlation coefficient matching method with a calculation formula:

$$R_{ccoeff\_normed} = \frac{\sum_{x',y'} T'(x', y') \cdot I'(x+x', y+y')}{\sqrt{\sum_{x',y'} T'(x', y')^2 \cdot \sum_{x',y'} I'(x+x', y+y')^2}}$$

T and I are scanning electron microscope image (simplified as T image) and circuit design layout (simplified as I image) respectively. x' and y' determine a position of a pixel in the T image, and T (x', y') is a gray value of the pixel at (x', y') in the T image. A position of each pixel in the I image is expressed as (x+x', y+y'), and the pixel value is I (x+x', y+y').

The present disclosure further provides a system for registering a circuit design layout and a scanning electron microscope image, which includes: an input module, configured to input a circuit design layout to be registered and a scanning electron microscope image to be registered; wherein the circuit design layout to be registered includes at least one design pattern, and the scanning electron microscope image to be registered includes at least one scanning pattern corresponding to the at least one design pattern; a binary processing module, configured to binarize the circuit design layout to be registered to obtain a binary image of the circuit design layout and binarize the scanning electron microscope image to be registered to obtain a binary of the scanning electron microscope image to be registered, wherein in the binary image of the circuit design layout to be registered, a gray value of the design pattern is 1, and a gray value outside the design pattern is 0; in the binary image of the scanning electron microscope image to be registered, a gray value of the scanning pattern is 1, and a gray value outside the scanning pattern is 0; a Gaussian filtering module, configured to Gaussian filter the binary image of the circuit design layout and the binary image of the scanning electron microscope image to make a gray value to be the largest at central axes of areas where the design pattern and the scanning pattern are located; and a registering module, configured to register the circuit design layout and the scanning electron microscope image according to the central axes.

The present disclosure further provides a method for calculating errors between a circuit design layout and an imaging of the circuit design layout, which includes: Step P1: registering a design pattern in a circuit design layout to be registered and a scanning pattern in a scanning electron microscope image to be registered by the method for registering a circuit design layout and a scanning electron microscope image; wherein the scanning electron microscope image corresponds to the imaging of the circuit design layout on a substrate; and Step P2: calculating errors between the design pattern and the scanning pattern to obtain errors between the circuit design layout and the imaging.

The present disclosure further provides an electronic device, which includes a storage device and a processor. The storage device is configured to store computer programs, which can be executed to perform the method for calculating errors between a circuit design layout and an imaging of the circuit design layout. The processor is configured to execute the computer programs to perform the method for calculating errors between a circuit design layout and an imaging of the circuit design layout.

Comparing with existing technologies, the method for registering the circuit design layout and the scanning electron microscope image provided by the present disclosure binarize the circuit design layout to be registered and the scanning electron microscope image to be registered to obtain the binary image of the circuit design layout and the binary image of the scanning electron microscope image respectively. The binary image of the circuit design layout and the binary image of the scanning electron microscope image are Gaussian filtered to make the gray value to be largest at the central axis of the areas where the design pattern and the scanning pattern are located. The design pattern and the scanning pattern can be registered according to the central axis. the method for registering the circuit design layout and the scanning electron microscope image is quick and accurate.

In Step S1, the design pattern covers the scanning patter, which ensure accuracy of registering.

Smoothing the design pattern in the circuit design layout to be registered can eliminate inevitable errors in advance, and error calculation results obtained in the method for calculating errors between the circuit design layout and the imaging can be closer to a degree that users want to know.

In the extracting the contour of the scanning electron microscope image to be registered, the edge detection algorithm combined with expansion treatment and etching treatment, or adaptive threshold binarization is used to make extracted contour more accurate, so as to ensure the accuracy of registering.

The system for registering the circuit design layout and the scanning electron microscope image also has above-mentioned advantages. Furthermore, the method for calculating errors between the circuit design layout and the imaging and the electronic device have advantages of accurate registration and accurate error calculation.

BRIEF DESCRIPTION OF THE DRAWINGS

FIG. 1 is a flow chart of a method for registering a circuit design layout and an electron microscope image according to a first embodiment of the present disclosure.

NUMERICAL REFERENCE IDENTIFICATION 10. method for registering a circuit design layout and an electron microscope image; 20. system for registering a circuit design layout and an electron microscope image; 21. input module; 22. binary image processing module; 23. Gaussian filtering module; 24. registering module; 221. smoothing module; 223. denoising module; 222. first filling and binary processing module; 224. contour extracting module; 225. second filling and binary processing module; 30. method for calculating a circuit design layout and an image of the circuit design layout; 40. electronic device; 41. processor; 42. storage device.

DETAILED DESCRIPTION

In order to make the objects, technical solutions and advantages of the invention clearer, the invention will be further described in detail in combination with the drawings and the embodiments. It should be understood that the embodiments described herein are only used to explain the invention and are not used to limit the invention.

First Embodiment

Referring to FIG. 1, a first embodiment of the present disclosure provides a method 10 for registering a circuit design layout and an electron microscope image, through which the circuit design layout and an image of the circuit design layout can be aligned.

The method 10 for registering a circuit design layout and an electron microscope image includes:

Step S1: providing a circuit design layout and an electron microscope image to be registered. The circuit design layout to be registered includes at least one design pattern, the scanning electron microscope image to be registered includes at least one scanned image corresponding to the at least one design pattern. The at least one design pattern covers the at least one scanned image.

Step S2: binary processing the circuit design layout to be registered to obtain a binary image of the circuit design layout, in the binary image of the circuit design layout, a gray value in a design pattern area is 1, and a gray value outside the design pattern area is 0; binary processing the scanning electron microscope image to be registered to obtain a binary image of the scanning electron microscope image, in the binary image of the scanning electron microscope image, a gray value in a scanning pattern area is 1, and a gray value outside the scanning pattern area is 0;

Step S3: Gaussian filtering the binary image of the circuit design layout and the binary image of the scanning electron microscope image to maximize gray values at central axes of the design pattern area and the scanning pattern area.

Step S4: registering the circuit design layout and the scanning electron microscope image according to the central axes of the design pattern area and the scanning pattern area.

Figure 2:
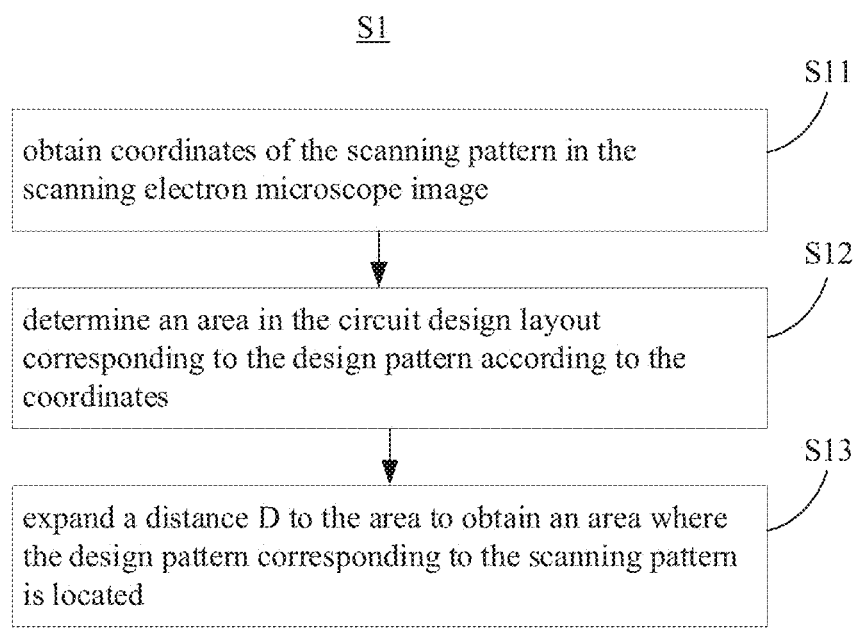
FIG. 2 is a flow chart of a Step S1 of FIG. 1.

Referring to FIG. 2, Step S1 includes:

Step S11: obtaining coordinates of the scanned image in the scanning electron microscope image to be registered;

Step S12: determining corresponding area in the circuit design layout to be registered according to the coordinates; and Step S13: extending a distance D to the corresponding area to obtain the design pattern corresponding to the scanning pattern.

Since there is not much difference between coordinates of the scanning pattern in the scanning electron microscope image and the design pattern in the circuit design layout, in Step S12, an approximate position of the design pattern can be obtained according to the coordinates of the scanning pattern in the scanning electron microscope image. It can be understood that the circuit design layout and electron microscope image to be registered can be an entire image corresponding to an integrated circuit or a part of the entire image.

In Step S13, D is not greater than 60 nm, preferably, D is not greater than 50 nm. The design pattern with extended distance D can usually cover corresponding scanning pattern to facilitate accurate registration results.

Figure 3A:
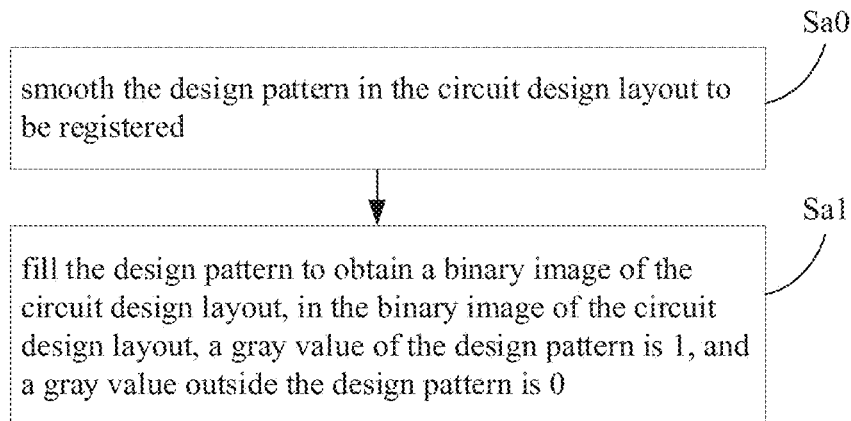
FIGS. 3A and 3B are flow charts of a Step S2 of FIG. 1 respectively.

Referring to FIG. 3A, in Step S2, binary processing the circuit design layout to obtain the binary image of the circuit design layout includes:

Step Sa0: smoothing the design pattern in the circuit design layout to be registered;

Step Sa1: filling the design patter to obtain the binary image of the circuit design layout, the gray value of design pattern area in the binary image of the circuit design layout is 1, and the gray value outside the design pattern in the binary image of the circuit design layout is 0.

It should be understood, the smoothing is configured to smooth corners between edges, such as a right angle in the design pattern, which can be turned into a fillet after being smoothed.

In Step Sa1, the design pattern is filled with white, and then the circuit design layout is binarized to obtain the binary image of the circuit design layout. In the binary image of the circuit design layout, the gray value in the design pattern area is 1 and the gray value outside the design pattern area is 0. It can be understood that in this step, the smoothed circuit design layout can be firstly binarized, and then pixels inside the design pattern can be filled with white to obtain the binary image of the circuit design layout. In the binary image of the circuit design layout, the gray value in the design pattern area is 1 and the gray value outside the design pattern area is 0. Filling before binarization or filling after binarization belongs to the scope of Step Sa1.

Figure 3B:
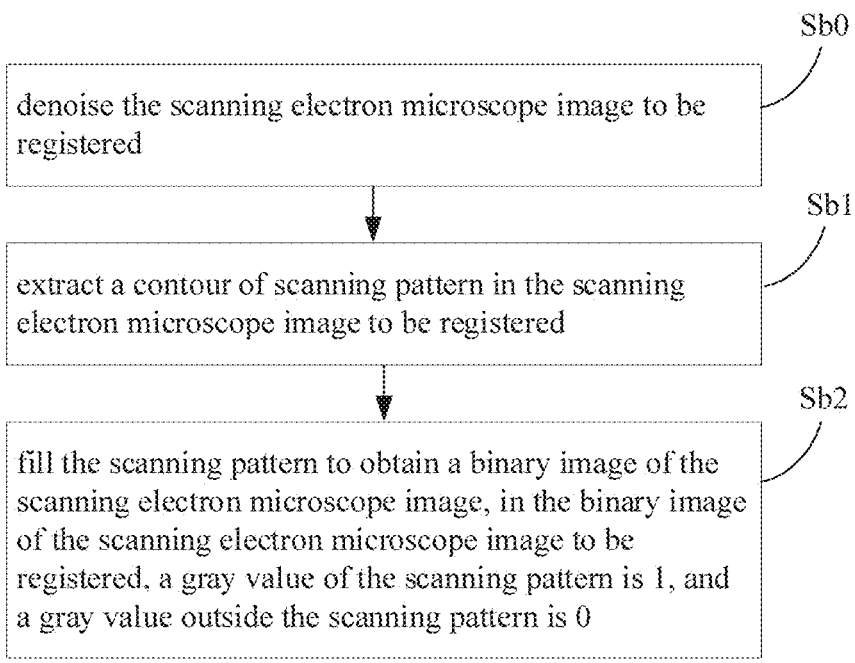

Referring to FIG. 3B, in Step S2, binary processing the scanning electron microscope image to be registered to obtain the binary image of the scanning electron microscope image includes:

Step Sb0: denoising the scanning electron microscope image to be registered;

Step Sb1: extracting contour of the scanning electron microscope image; and

Step Sb2: filling the scanned image to obtain the binary image of the scanning electron microscope image. In the binary image of the scanning electron microscope image, the gray value in the scanning pattern area is 1 and the gray value outside the scanning pattern area is 0.

Optionally, Step Sb0 can be omitted. Methods of denoising can include, but not limited to, median filtering, mean filtering or Gaussian filtering.

Figure 4A:
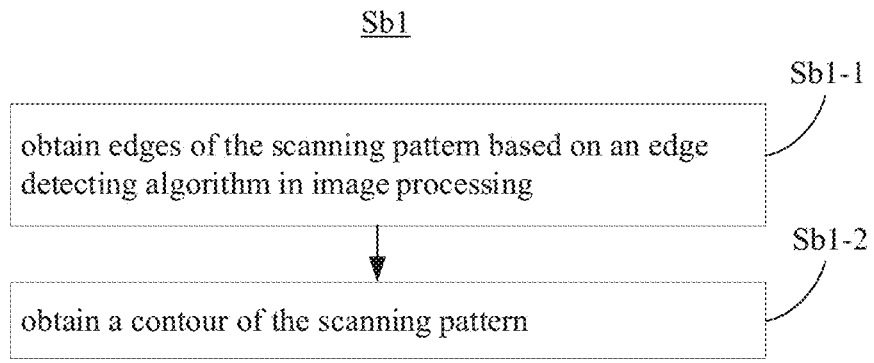
FIGS. 4A, 4B and 4C are flow charts of variants of a Step b1 of FIG. 3B respectively.

Referring to FIG. 4A, in at least one embodiment, Step Sb1 can include:

Step Sb1-1, obtaining edges of the scanning pattern based on an edge detecting algorithm in image processing; and Step Sb1-s: obtaining contour of the scanning pattern by expansion treatment and etching treatment.

In Step Sb1-a, the edge detecting algorithm can include, but not limited to, a gradient algorithm. However, because the contour of the scanning pattern in the scanning electron microscope image usually has a certain width, two edges are usually detected by the edge detection algorithm. In Step sb1-2, pixels between the two edges can be filled up by the expansion treatment. At this time, the contour with a certain width can be obtained, and the contour of the scanning pattern with a narrowed width can be obtained by the etching treatment. The contour of the scanning pattern obtained by this method is more accurate.

Figure 4B:
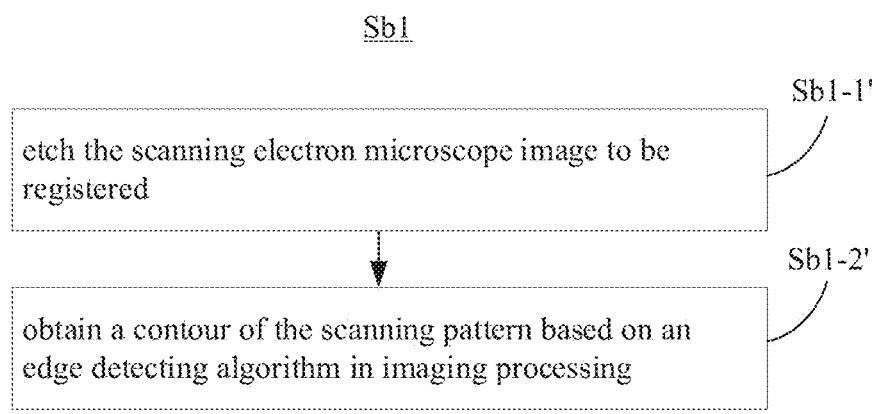

Referring to FIG. 4B, in at least one embodiment, Step Sb1 includes:

Step Sb1-1': etching the scanning electron microscope image to be registered; and Step Sb1-2': obtaining contour of the scanning electron microscope image based on the edge detection algorithm in image processing.

Since the contour of the scanning pattern in the scanning electron microscope image usually has a certain width, which will lead to inaccurate contour acquisition of the scanning pattern, in Step sb1-1', etching the scanning electron microscope image to be registered can refine a contour width of the scanning pattern and avoid occurrence of two edges in edge detection.

Figure 4C:
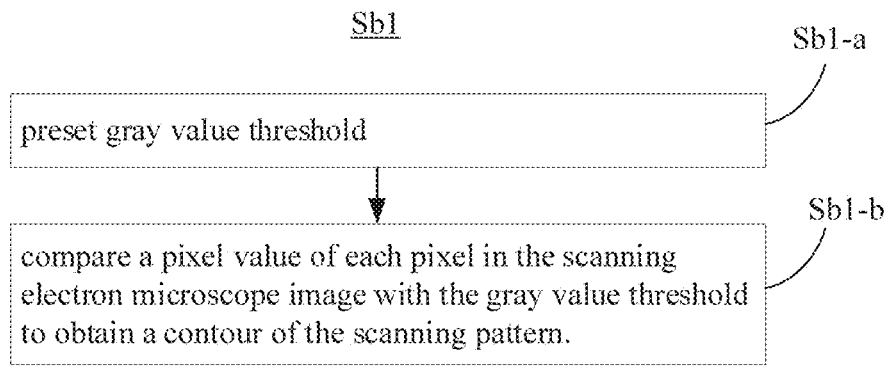

Referring to FIG. 4C, in at least one embodiment, Step Sb1 can adopts adaptive threshold to binarize to obtain the contour of the scanning electron microscope image, it can include:

Step Sb1-a: presetting gray value threshold; and

Step Sb1-b: comparing pixel values of the pixels in the scanning electron microscope image to be registered with the gray value threshold to obtain the contour of the scanning electron microscope image.

In Step Sb1, before extracting the contour of the scanning electron microscope image to be registered, the scanning electron microscope image to be registered can be divided into multiple blocks. The number of the blocks can be 2 to 8, preferably, the number of the blocks is 4.

In Step S3, the binary image of the circuit design layout is Gaussian filtered to obtain a first image. The binary image of the scanning electron microscope image is Gaussian filtered to obtain a second image. In the first image, the gray value at the central axis of the area where the design pattern is located is the largest, that is, the first image at the center axis is the brightest, and in the second image, the gray value at the central axis of the area where the scanning pattern is located is the largest, that is, the second image at the center axis is the brightest.

In Step S4, in at least one embodiment, registration of the circuit design layout and the scanning electron microscope image is performed by an image template matching method. Preferably, the image template matching method can include a normalized correlation coefficient matching method with a calculation formula:

$$R_{ccoeff\_normed} = \frac{\sum_{x',y'} T'(x', y') \cdot I'(x+x', y+y')}{\sqrt{\sum_{x',y'} T'(x', y')^2 \cdot \sum_{x',y'} I'(x+x', y+y')^2}}$$

T and I are scanning electron microscope image (simplified as T image) and circuit design layout (simplified as I image) respectively. It is supposed that a size of the I image is W*H, a size of the T image is w*h (h≤ H, w≤W). X' and y' determine a position of a pixel in the T image (1 ≤ x'≤ w, 1≤ y'≤ h), and T (x', y') is the gray value of the pixel at (x', y') in the T image. 1≤ x≤ W−w+1, 1≤ y≤ H−h+1. Take a subgraph with the size of w*h in the lower left corner at the coordinate (x, y) in the I image, then a position of each pixel on the subgraph can be expressed as (x+x', y+y'), and the pixel value is I (x+x', y+y'). The normalized correlation coefficient matching method has advantages of small amount of calculation and accurate matching.

Figure 5A:
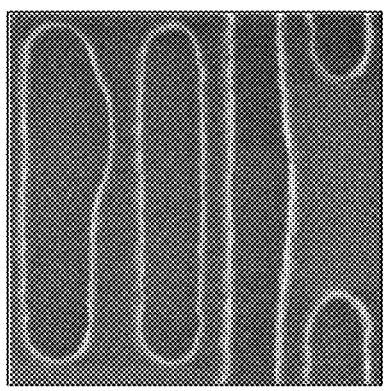
FIGS. 5A to 5J illustrate an exemplary circuit design layout and a scanning electron microscope image in different processes of the method of FIG. 1 respectively.
Figure 5B:
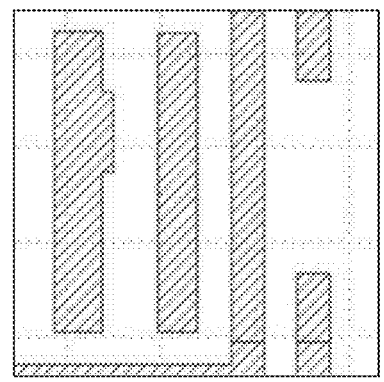
Figure 5C:
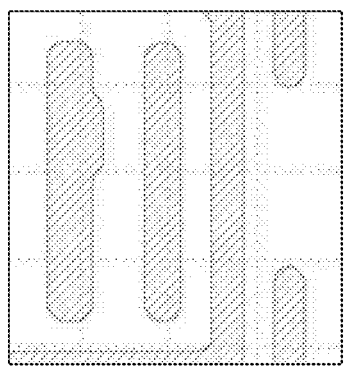
Figure 5D:
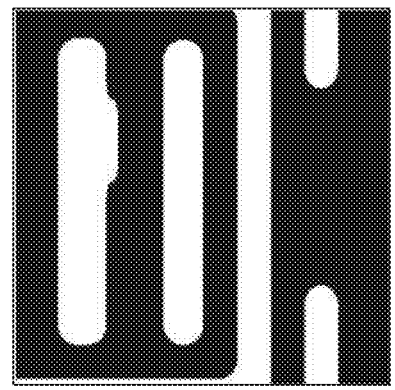
Figure 5E:
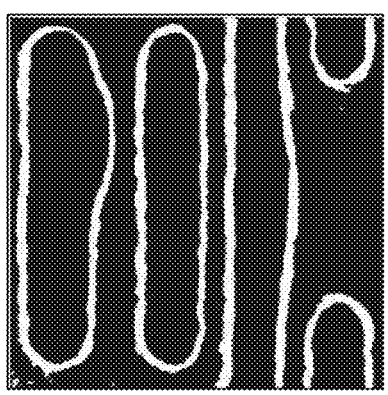
Figure 5F:
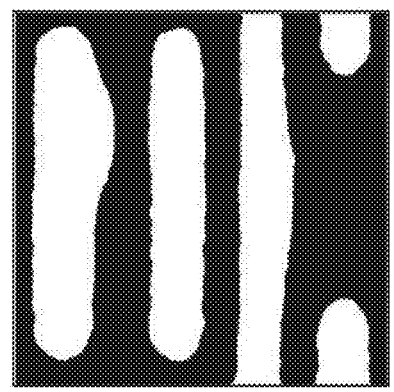
Figure 5G:
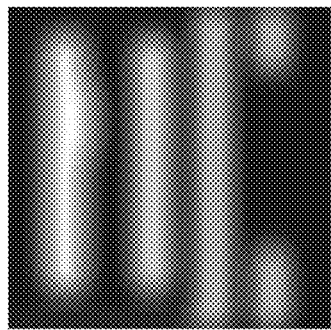
Figure 5H:
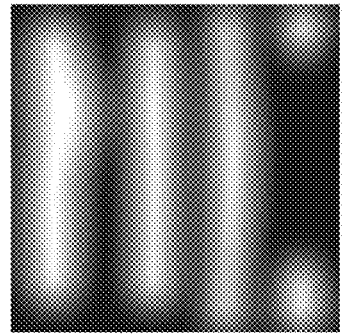
Figure 5I:
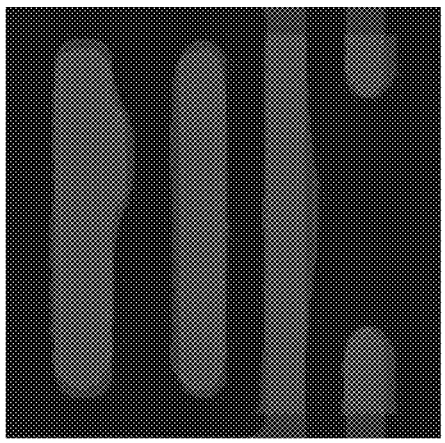
Figure 5J:
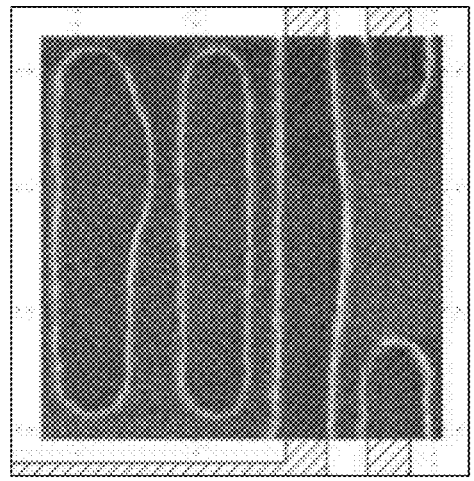

Referring to FIGS. 5A to 5J, in at least one embodiment, FIG. 5A is a scanning electron microscope image to be registered provided by an exemplary embodiment, FIG. 5B is a circuit design layout to be registered provided by an exemplary embodiment. The circuit design layout to be registered in FIG. 5B is smoothed to turn the right corners into fillets, which is shown in FIG. 5C. The design pattern in the circuit design layout in FIG. 5C is filled to obtain the binary image of the circuit design layout, which is shown in FIG. 5D. In the binary image of the circuit design layout, the gray value of the design pattern is 1, the gray value outside the design pattern is 0. The scanning electron microscope image in FIG. 5A is Gaussian filtered. Specifically, a 17*17 Gaussian kernel is used for Gaussian filtering with sigma=2. The scanning electron microscope image is denoised and then a contour of the scanning electron microscope image is extracted to obtain FIG. 5E. The scanning pattern in FIG. 5E is filled to obtain the binary image of the scanning electron microscope image shown in FIG. 5F. The binary image of the circuit design layout shown in FIG. 5D and the binary image of the scanning electron microscope image shown in FIG. 5F are Gaussian filtered respectively to obtain FIG. 5G and FIG. 5H. In this embodiment, a 81*81 Gaussian kernel and a Gaussian filter with sigma=40 is used for Gaussian filtering. In FIGS. 5G and 5H, the gray value is the largest at the central axis of the areas where the design pattern and scanning pattern are located. As shown in FIGS. 5I and 5J, the design pattern and scanning pattern are registered.

Second Embodiment

Figure 6:
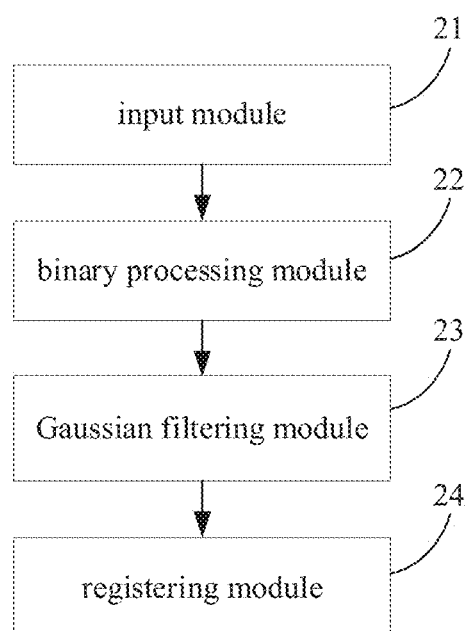
FIG. 6 is a schematic view of blocks of a system for registering a circuit design layout and an electron microscope image according to a second embodiment of the present disclosure.
Figure 7:
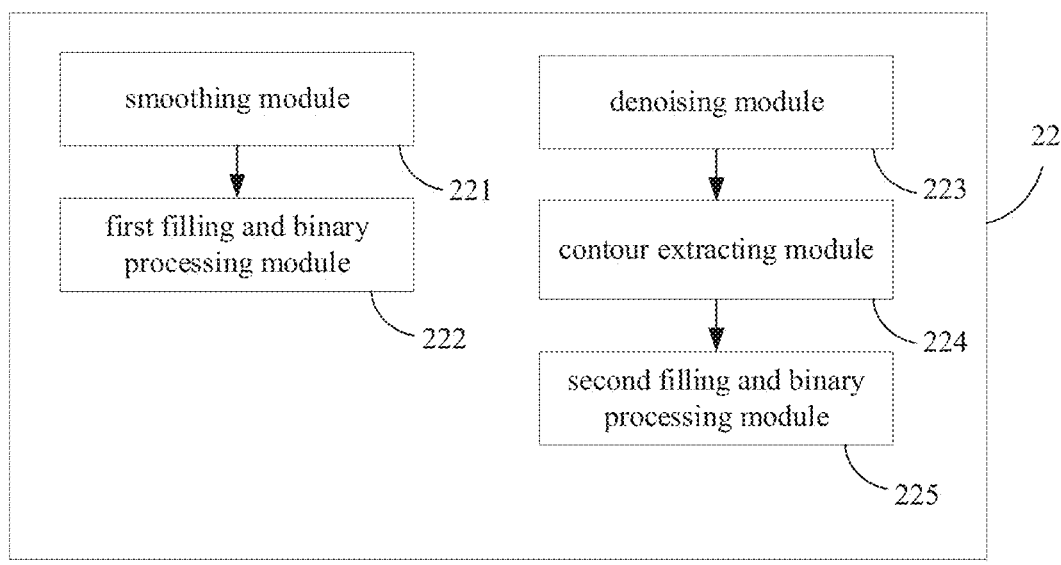
FIG. 7 is a schematic view of blocks of a binary image processing module of FIG. 6.
Figure 8:
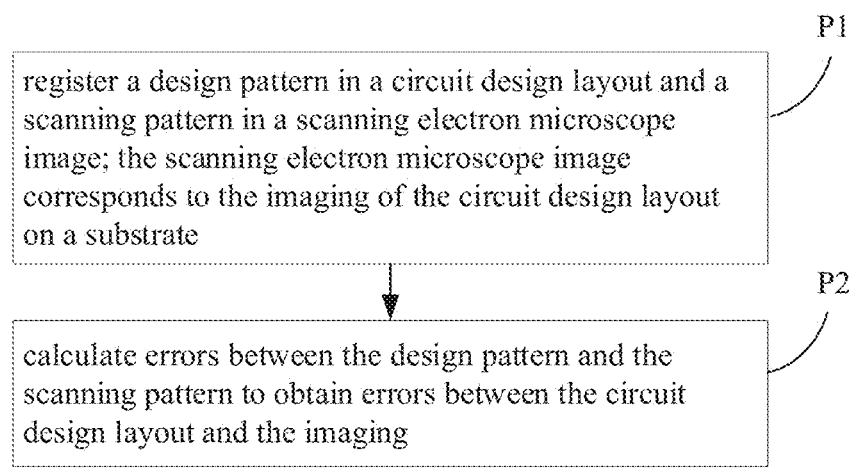
FIG. 8 is a flow chart of a method for calculating errors between a circuit design layout and an image of the circuit design layout according to a third embodiment of the present disclosure.
Figure 9:
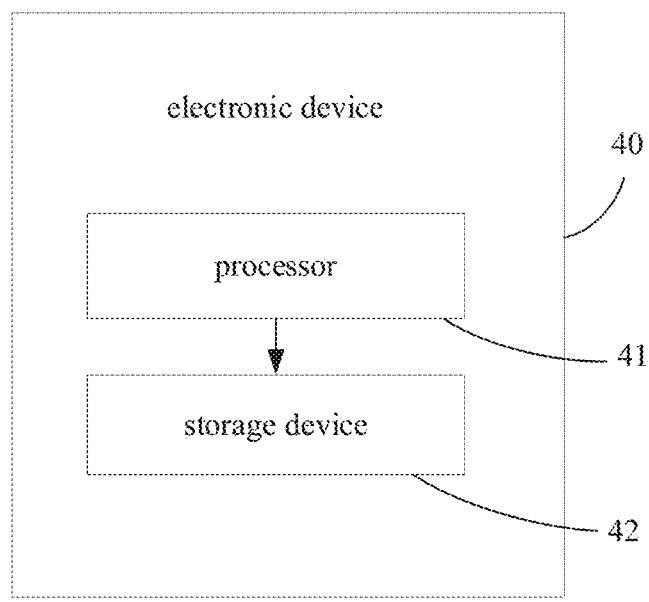
FIG. 9 is a schematic view of blocks of an electronic device according to a fourth embodiment.

Referring to FIG. 6, a second embodiment of the present disclosure provides a system 20 for registering a circuit design layout and a scanning electron microscope image. The system 20 for registering a circuit design layout and a scanning electron microscope image includes an input module 21, a binary processing module 22, a Gaussian filtering module 23, and a registering module 24.

The input module 21 is configured to input a circuit design layout to be registered and a scanning electron microscope image to be registered. The circuit design layout to be registered includes at least one design pattern, and the scanning electron microscope image includes at least one scanning pattern corresponding to the at least one design pattern. The design pattern covers corresponding scanning pattern.

The binary processing module 22 is configured to binarize the circuit design layout to be registered to obtain a binary image of the circuit design layout. In the binary image of the circuit design layout, a gray value of the design pattern is 1, and a gray value outside the design pattern is 0. The binary processing module 22 is further configured to binarize the scanning electron microscope image to obtain a binary image of the scanning microscope image. In the binary image of the scanning microscope image, a gray value of the scanning pattern is 1, and a gray value outside the scanning pattern is 0.

The Gaussian filter 23 is configured to Gaussian Filter the binary image of the circuit design layout and the binary image of the scanning microscope image to make the gray value to be the largest at the central axis of the areas where the design pattern and scanning pattern are located.

The registering module 24 is configured to register the design pattern and the scanning pattern.

In at least one embodiment, the binary processing module 22 includes a smoothing module 221, a first filling and binary processing module 222, a denoising module 223, a contour extracting module 224, and a second filling and binary processing module 225.

The smoothing module 221 is configured to smooth the design patter in the circuit design layout to be registered. The first filling and binary processing module 222 is configured to fill the design pattern to obtain the binary image of the circuit design layout. In the binary image of the circuit design layout, a gray value of the design pattern is 1, and a gray value outside the design pattern is 0. The denoising module 223 is configured to denoise the scanning electron microscope image to be registered. The contour extracting module 224 is configured to extract a contour of the scanning electron microscope image to be registered. The second filling and binary processing module 225 is configured to fill the scanning pattern to obtain a binary image of the scanning microscope image. In the binary image of the scanning microscope image, a gray value of the scanning pattern is 1, and a gray value outside the scanning pattern is 0.

It should be understood that the system 20 for registering the circuit design layout and the scanning electron microscope image is configured to perform the method 10 for registering the circuit design layout and the scanning electron microscope image. Functions described in the method 10 for registering the circuit design layout and the scanning electron microscope image can be executed by corresponding modules of the system 20 for registering the circuit design layout and the scanning electron microscope image.

Third Embodiment

A third embodiment of the present disclosure provides a method 30 for calculating errors between a circuit design layout and an imaging of the circuit design layout. The method 30 for calculating errors between a circuit design layout and an imaging of the circuit design layout includes:

Step P1: registering a design pattern in the circuit design layout and a corresponding scanning pattern in the imaging. The imaging is an imaging of the circuit design layout on a substrate. The substrate can be a silicon wafer.

Step P2: calculating errors between the design pattern and the corresponding scanning pattern to obtain errors between the circuit design layout and the imaging.

In Step P1, the method 10 for registering the circuit design layout and the scanning electron microscope image described in the first embodiment can be used to perform registering the design pattern and the scanning pattern. The imaging is an imaging of the circuit design layout on a substrate.

Fourth Embodiment

A fourth embodiment of the present disclosure provides an electronic device 40, which includes a storage device 42 and a processor 41. The storage device 42 is configured to store computer programs, which can be executed to perform the method 30 for registering a circuit design layout and a scanning electron microscope image.

The processor 41 is configured to execute the computer programs to perform the method 30 for registering a circuit design layout and a scanning electron microscope image.

Comparing with existing technologies, the method for registering the circuit design layout and the scanning electron microscope image provided by the present disclosure binarize the circuit design layout to be registered and the scanning electron microscope image to be registered to obtain the binary image of the circuit design layout and the binary image of the scanning electron microscope image respectively. The binary image of the circuit design layout and the binary image of the scanning electron microscope image are Gaussian filtered to make the gray value to be largest at the central axis of the areas where the design pattern and the scanning pattern are located. The design pattern and the scanning pattern can be registered according to the central axis. the method for registering the circuit design layout and the scanning electron microscope image is quick and accurate.

In Step S1, the design pattern covers the scanning patter, which ensure accuracy of registering.

Smoothing the design pattern in the circuit design layout to be registered can eliminate inevitable errors in advance, and error calculation results obtained in the method for calculating errors between the circuit design layout and the imaging can be closer to a degree that users want to know.

In the extracting the contour of the scanning electron microscope image to be registered, the edge detection algorithm combined with expansion treatment and etching treatment, or adaptive threshold binarization is used to make extracted contour more accurate, so as to ensure the accuracy of registering.

The system for registering the circuit design layout and the scanning electron microscope image also has above-mentioned advantages. Furthermore, the method for calculating errors between the circuit design layout and the imaging and the electronic device have advantages of accurate registration and accurate error calculation.

According to the embodiments of the present disclosure, the processes described in above methods may be implemented as a computer software program. For example, embodiments of the present disclosure include a computer program product that includes a computer program carried on a computer-readable medium. The computer program includes program codes for executing a method shown in a flow chart. In such an embodiment, the computer program may be downloaded and installed from the network through a communication section, and/or installed from a removable medium. When the computer program is executed by the central processing unit (CPU), the above functions defined in the methods of the present disclosure are executed. It should be noted that the computer-readable medium described in the present disclosure can be a computer-readable signal medium or a computer-readable storage medium or any combination of the two. Computer readable storage medium can include, but is not limited to, systems, devices or components including, but not limited to, electrical, magnetic, optical, electromagnetic, infrared, or semiconductor, or any combination of the above. More detailed examples of computer-readable storage medium may include, but are not limited to, an electrical connection with one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device or any suitable combination of the above. In the present disclosure, the computer-readable storage medium may be any tangible medium containing or storing a program, which may be used by or in combination with an instruction execution system, device or component. In the present disclosure, the computer-readable signal medium may include the data signal transmitted in the baseband or as part of the carrier wave, in which the computer-readable program code is carried. Such transmitted data signals may be in a variety of forms, including but not limited to electromagnetic signals, optical signals, or any suitable combination of the above. A computer-readable signal medium may also be any computer-readable medium other than a computer-readable storage medium, which may transmit, propagate or transmit a program for use by or in combination with an instruction execution system, device or component. The program codes contained on the computer-readable medium may be transmitted in any suitable medium, including but not limited to: wireless, wire, optical cable, RF, etc., or any suitable combination of the above.

The computer program codes for performing the operations of the present disclosure can be written in one or more programming languages or a combination thereof. The programming languages include object-oriented programming languages such as Java, Smalltalk, C++, and conventional procedural programming languages such as "C" or similar programming languages. The program codes can be completely executed on a user's computer, partially executed on the user's computer, executed as an independent software package, partially executed on the user's computer, partially executed on a remote computer, or completely executed on the remote computer or a server. In the case involving a remote computer, the remote computer may be connected to the user computer through any kind of networks, including a local area network (LAN) or a wide area network (WAN), or may be connected to an external computer (e.g., through the Internet using an Internet service provider).

The flow charts and module diagrams in the attached drawings illustrate possible architectures, functions and operations of systems, methods and computer program products according to various embodiments of the present application. In this regard, each block in a flow chart or a block diagram may represent a module, program segment, or part of code that contains one or more executable instructions for implementing a specified logical function. It should also be noted that in some alternative embodiments, functions identified in the blocks may also occur in a different order than those shown in the drawings. For example, two blocks represented successively can actually be executed basically in parallel, and they can sometimes be executed in an opposite order, depending on functions involved. It should also be noted that each block in the block diagram and/or a flow chart and the combination of blocks in the block diagram and/or the flow chart can be realized by a dedicated hardware based system performing specified functions or operations, or by a combination of dedicated hardware and computer instructions.

The above description are only embodiments of the present disclosure, and is not intended to limit the present disclosure. Any modifications, equivalent substitutions, improvements, etc. made within the spirit and scope of the present disclosure are intended to be included within the scope of the present disclosure.

What is claimed is:

1. A method for registering a circuit design layout and a scanning electron microscope image, comprising:
    Step S1: providing a circuit design layout to be registered and a scanning electron microscope image to be registered, wherein the circuit design layout to be registered comprises at least one design pattern, and the scanning electron microscope image to be registered comprises at least one scanning pattern corresponding to the at least one design pattern, the at least one design pattern covers the at least one scanning pattern;
    Step S2: binarizing the circuit design layout to be registered to obtain a binary image of the circuit design layout and binarizing the scanning electron microscope image to be registered to obtain a binary image of the scanning electron microscope image, wherein in the binary image of the circuit design layout, a gray value of the design pattern is 1, and a gray value outside the design pattern is 0; in the binary image of the scanning electron microscope image, a gray value of the scanning pattern is 1, and a gray value outside the scanning pattern is 0;
    Step S3: Gaussian filtering the binary image of the circuit design layout and the binary image of the scanning electron microscope image to make the gray value to be the largest at central axes of areas where the design pattern and the scanning pattern are located; and
    Step S4: registering the circuit design layout and the scanning electron microscope image according to the central axes by an image template matching method.

2. The method according to claim 1, wherein Step S1 comprises:
    Step S11: obtaining coordinates of the scanning pattern in the scanning electron microscope image;
    Step S12: determining an area in the circuit design layout corresponding to the design pattern according to the coordinates; and
    Step S13: expanding a distance D to the area to obtain an area where the design pattern corresponding to the scanning pattern is located, wherein D is not greater than 50 nm.

3. The method according to claim 1, before Step S2 or in Step S2 comprising Step Sa0: smoothing the design pattern in the circuit design layout to be registered; wherein Step S2 further comprises Step Sa1: filling the design pattern to obtain the binary image of the circuit design layout, in the binary image of the circuit design layout, a gray value of the design pattern is 1, and a gray value outside the design pattern is 0.

4. The method according to claim 1, wherein Step S2 comprises:
    Step Sb1: extracting a contour of the scanning pattern in the scanning electron microscope image to be registered; and
    Step Sb2: filling the scanning pattern to obtain the binary image of the scanning electron microscope image, in the binary image of the scanning electron microscope image, a gray value of the scanning pattern is 1, and a gray value outside the scanning pattern is 0.

5. The method according to claim 4, wherein Step Sb1 comprises:
    Step Sb1-1: obtaining edges of the scanning pattern based on an edge detecting algorithm in image processing; and Step Sb1-2: obtaining a contour of the scanning pattern; or
    Step Sb1-1': etching the scanning electron microscope image to be registered; and
    Step Sb1-2': obtaining a contour of the scanning pattern based on an edge detecting algorithm in imaging processing.

6. The method according to claim 4, wherein Step Sb1 comprises:
    Step Sb1-a: presetting gray value threshold; and
    Step Sb1-b: comparing a pixel value of each pixel in the scanning electron microscope image with the gray value threshold to obtain a contour of the scanning pattern.

7. The method according to claim 1, wherein the binary image of the circuit design layout is Gaussian filtered to obtain a first image, and the binary image of the scanning electron microscope image is Gaussian filtered to obtain a second image;
    the image template matching method in Step S4 comprises a normalized correlation coefficient matching method with a calculation formula:

$$R_{ccoeff\_normed} = \frac{\sum_{x',y'} T'(x', y') \cdot I'(x+x', y+y')}{\sqrt{\sum_{x',y'} T'(x', y')^2 \cdot \sum_{x',y'} I'(x+x', y+y')^2}}$$

T and I are scanning electron microscope image (simplified as T image) and circuit design layout (simplified as I image) respectively, x' and y' determine a position of a pixel in the T image, and T (x', y') is a gray value of the pixel at (x', y') in the T image, A position of each pixel in the I image is expressed as (x+x', y+y'), and the pixel value is I (x+x', y+y').

8. A system for registering a circuit design layout and a scanning electron microscope image, comprising:
- an input module, configured to input a circuit design layout to be registered and a scanning electron microscope image to be registered; wherein the circuit design layout to be registered comprises at least one design pattern, and the scanning electron microscope image to be registered comprises at least one scanning pattern corresponding to the at least one design pattern;
- a binary processing module, configured to binarize the circuit design layout to be registered to obtain a binary image of the circuit design layout and binarize the scanning electron microscope image to be registered to obtain a binary of the scanning electron microscope image to be registered, wherein in the binary image of the circuit design layout to be registered, a gray value of the design pattern is 1, and a gray value outside the design pattern is 0; in the binary image of the scanning electron microscope image to be registered, a gray value of the scanning pattern is 1, and a gray value outside the scanning pattern is 0;
- a Gaussian filtering module, configured to Gaussian filter the binary image of the circuit design layout and the binary image of the scanning electron microscope image to make a gray value to be the largest at central axes of areas where the design pattern and the scanning pattern are located, and
- a registering module, configured to register the circuit design layout and the scanning electron microscope image according to the central axes by an image template matching method.

9. An electronic device, comprising a storage device and a processor, wherein the storage device is configured to store computer programs, which can be executed to perform the method of claim 1;
- the processor is configured to execute the computer programs to perform the method of claim 1.

* * * * *